United States Patent [19]

Yakmovitz

[11] Patent Number: 4,709,733

[45] Date of Patent: Dec. 1, 1987

[54] ELECTRON TUBE PIN-SENSING AND STRAIGHTENING DEVICE

[75] Inventor: Kenneth J. Yakmovitz, Jermyn, Pa.

[73] Assignee: RCA Corporation, Princeton, N.J.

[21] Appl. No.: 888,804

[22] Filed: Jul. 24, 1986

[51] Int. Cl.⁴ .............................................. B21F 1/02
[52] U.S. Cl. .................................... 140/147; 29/705; 324/158 F
[58] Field of Search ...................... 140/1, 147; 445/63, 445/64; 324/158 R, 158 F, 158 T; 209/573, 574; 29/705

[56] References Cited

U.S. PATENT DOCUMENTS 2,554,982  5/1951  Hartley et al. ................... 324/158 R
3,517,144  1/1969  Arsenault et al. .................... 200/46
4,068,170  1/1978  Chayka et al. ..................... 324/72.5
4,463,310  7/1984  Whitley .................................. 324/73
4,574,236  3/1986  Hechtman ........................... 324/158
4,658,212  4/1987  Ozawa et al. .................... 324/158 F

FOREIGN PATENT DOCUMENTS 0124444  11/1984  European Pat. Off. ............. 29/705

Primary Examiner—Lowell A. Larson
Attorney, Agent, or Firm—E. M. Whitacre; D. H. Irlbeck; L. L. Hallacher

[57] ABSTRACT

A device for sensing and straightening the pins of a kinescope is configured congruently to the outside of the base of the kinescope. A slidable pin is included in the device to engage the high voltage pin of the kinescope. The pin closes a switch which turns on a light to indicate that the high voltage pin is properly located in the silo of the base.

3 Claims, 2 Drawing Figures

ELECTRON TUBE PIN-SENSING AND STRAIGHTENING DEVICE

BACKGROUND

This invention relates generally to electron tubes and particularly to a pin sensing and straightening device for television picture tubes.

Electron tubes have various electrodes to which operating voltages are applied. The operating voltages are applied to the electrodes by connector pins which pass through the envelope of the tube. Television picture tubes (kinescopes) are funnel shaped, and have a neck extending from the narrow portion of the funnel. The neck contains an electron gun which provides the electron beams to form the picture on the screen of the tube. The operating voltages necessary to provide the electron beams are applied to the electrodes of the gun by connector pins which pass through the end of the neck.

After a kinescope is completely manufactured an insulative base is applied to the neck in engagement with the connector pins. The base is configured so that a socket, which is included in the television receiver, mates with the base such that the base and socket mate in only one orientation. The socket contains contacts which engage the connector pins whereby the proper operating voltages are applied to all the connector pins of the tube. Typically, all the operating voltages are different and therefore the connector pins are electrically isolated by the base. With a kinescope, one of the electrodes receives a much higher voltage than the other electrodes of the gun. For this reason, it is essential that the pin receiving the higher voltage be electrically isolated from the other pins by a higher measure of insulation. Typically, this is accomplished by forming a silo portion in the base so that the high voltage pin is completely surrounded by an insulative material.

The manufacture of a kinescope is a complex operation and therefore the tubes go through substantial manufaturing steps after the electron guns and connector pins are sealed into the necks of the tubes. For this reason, there is risk of one or more of the electron pins being bent or otherwise damaged. When the tube base is applied to the neck, the bases typically are configured so that most of the pins are visible whereby the presence of the pins, or whether or not the pins are bent, can be determined by visual inspection. However, the high voltage pin typically is hidden in the silo and therefore visually determining whether or not the high voltage pin is bent, or present in the silo is extremely difficult. For this reason, there is a need for a device for sensing the high voltage pin contained within the silo and also for a device which will straighten bent pins. The invention fulfills these needs.

SUMMARY

An electron tube pin sensing and straightening device for use with an electron tube having a plurality of electrical connecting pins and a base for receiving the pins, at least one of the pins being arranged in a silo portion of the base includes a sturdy support member. An insulative portion is applied to the support member and includes an aperture configured to receive the base, and having a silo portion for receiving the silo, whereby the aperture and the insulative portion mate in a particular orientation. A transparent member is applied to the sturdy support, and has a cavity juxtaposed the sturdy support. A slidable pin is arranged in the silo portion of the insulative portion and extends into the cavity. The slidable pin includes an actuator pin, slidable pin being positioned to engage said at least one pin when said sensing and straightening device is mated with said base. An indicator circuit is arranged in the cavity, and includes a battery, a light and a switch positioned for actuation by the actuator arm.

BRIEF DESCRIPTIONS OF THE DRAWINGS

DETAILED DESCRIPTION

Figure 1:
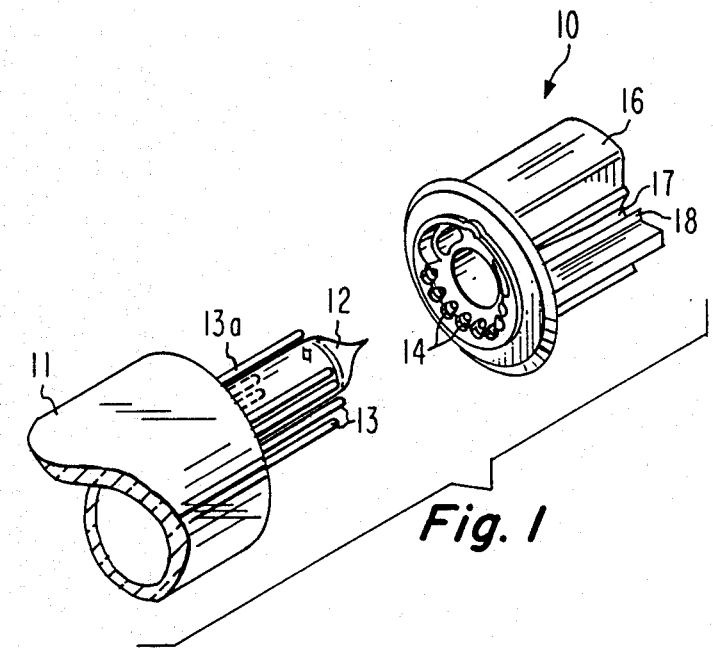
FIG. 1 shows the electrode pins extending from the neck of a kinescope, and a base to be mated with the neck.

FIG. 1 shows a base 10 which will be mated with the neck 11 of a kinescope (not shown). The neck 11 includes a terminus 12, which remains from the evacuation of the tube. A plurality of pins 13 extend from the end of the neck 11 substantially parallel with the terminus 12. The operation of the kinescope requires that the pins 13 be electrically separated. One of the pins 13a receives a high voltage required for the operation of the electron gun and therefore additional electrical isolation from the other pins 13 is required for this pin.

The base 10 includes a plurality of apertures 14 which are arranged in a pattern so that each of the apertures 14 receives one of the pins 13. A silo portion 16 receives the high voltage pin 13a to provide the additional electrical isolation required for this pin. Slots 17 are in alignment with the apertures 14 so that the pins 13, after passing through the apertures 14, rest on the bottoms of the slots 17. The slots 17 are separated by ribs 18, which provide the required electrical isolation for the pins 13.

After the base 10 is permanently affixed to the neck 11 of a kinescope, and the kinescope is mounted into a receiver, the receiver circuitry is electrically coupled to the tube by the use of a socket (not shown) which contains an aperture configured congruent to the outside configuration of the base 10. Accordingly, the socket and base mate in only one particular orientation and the proper operating voltages are applied to the connector pins 13 by contacts which are included in the socket. Typically, the pins 13 and aperture 14 are dimensioned so that there is an interference fit between the pins and the apertures. Also before a base 10 is applied to a neck 11, the tube goes through a large number of manufacturing and testing steps. For these reasons, it is possible for one or more of the pins 13 to be bent prior to, or during, the application of the base to the neck. The pins 13 rest in the open slots 17, and therefore bent, or missing, pins can be easily identified visually. However, the high voltage pin 13a is concealed by the silo 16 and the bent pin, or missing status of this pin is very difficult, if not impossible, to detect visually. A preferred embodiment of a device for straightening bent pins and for detecting the absence, or bent condition, of the high voltage pin 13a is shown in FIG. 2.

Figure 2:
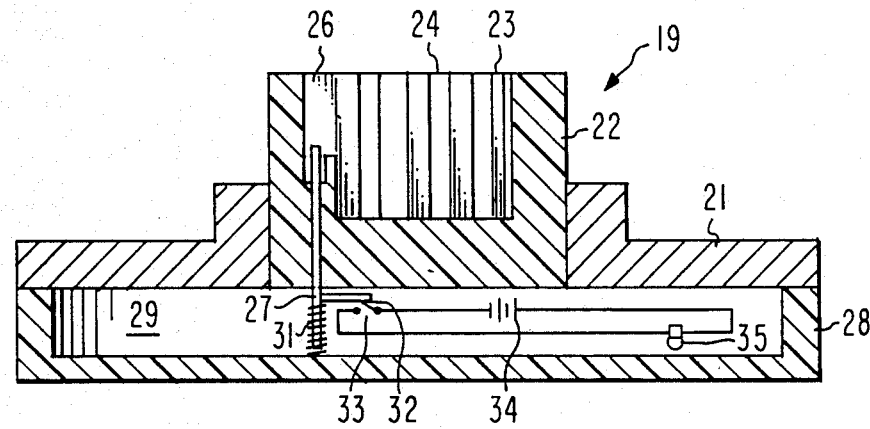
FIG. 2 is a cross section of a preferred embodiment of an electron tube pin sensing and straightening device.

In FIG. 2, a tube pin sensing and straightening device 19 includes a sturdy support portion 21. An insulative portion 22 is permanently fixed in the sturdy support 21. The insulative portion 22 includes a centered aperture 23 which is configured congruently to the outside configuration of the base 10 of FIG. 1. Accordingly, the ribs 18 of the base 10 are received by grooves 24 in the aperture 23 of the insulative portion 22. The insulative portion 22 also includes a silo portion 26 which is configured to receive the silo 16 of the base 10. A slidable pin 27 passes through the insulative portion 22 and extends into the silo portion 26. A transparent insulative member 28, including a cavity 29, is permanently affixed to one side of the sturdy support 21. The slidable pin 27 extends into the cavity 29 and is spring biased by a spring 31. An actuator arm 32 is permanently fixed to the pin 27. A switch 33, battery 34 and light 35 from a detector circuit and are also contained in the cavity 29. The switch 33 is positioned to engage the actuator arm 32 of the pin 27. When the switch 33 is closed, the battery 34 energizes the light bulb 35 which lights to indicate the depressed condition of the slidable pin 27.

In operation, the pin straightening and sensing device 19 is slid onto the base 10 of the tube to be tested. The end of the slidable pin 27 engages the high voltage pin 13a in the silo 16 of the base 10 and the pin 27 slides in the cavity 29 whereby the actuator arm 32 closes the switch 33. The lighting of the light 35 shows that the tube being tested has a high voltage pin 13 properly located within the silo of the base. When the high voltage pin is bent or missing from the tube, the slidable pin 27 is not moved into engagement with the switch 32 and the light bulb does not light. The inventive device also serves as a pin straightening device because the device is dimensioned to snugly fit onto the base 10 so that any pins which do not firmly ride against the bases of the slots 17 are biased inwardly toward the bases of the slots 17 to effectively straighten the pins.

What is claimed is:

1. An electron tube pin sensing and straightening device for use with an electron tube having a plurality of electrical connecting pins and a base for receiving said pins, at least one of said pins being arranged in a silo portion of said base, said pin sensing and straightening device comprising:

a sturdy support member;

an insulative portion affixed to said support member, said insulative portion having an aperture configured to receive said base, and having a silo portion for receiving said silo, whereby said aperture and said insulative portion mate in a particular orientation;

a transparent member affixed to said sturdy support, said transparent member having a cavity juxtaposed said sturdy support;

a slidable pin arranged in said silo portion of said insulative portion, and extending into said cavity, said slidable pin including an actuator arm; said slidable pin being positioned to engage said at least one pin when said sensing and straightening device is mated with said base, and an indicator circuit arranged in said cavity, said indicator circuit including a battery, a light and a switch positioned for actuation by said actuator arm.

2. The device of claim 1 wherein said base includes slots separated by ribs whereby said connecting pins rest in said slots, and wherein said sensing and straightening device includes slots for receiving said ribs whereby said device and said base snugly engage to straighten bent pins.

3. The device of claim 2 wherein said electron tube is a kinescope and said at least one pin is the high voltage pin.

* * * * *